United States Patent
Gabriel et al.

(10) Patent No.: US 6,297,170 B1
(45) Date of Patent: Oct. 2, 2001

(54) SACRIFICIAL MULTILAYER ANTI-REFLECTIVE COATING FOR MOS GATE FORMATION

(75) Inventors: Calvin Todd Gabriel, Cupertino; Jacob Haskell, Palo Alto; Satyendra Sethi, Pleasonton, all of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/102,797

(22) Filed: Jun. 23, 1998

(51) Int. Cl.[7] .................................................. H01L 21/302
(52) U.S. Cl. ........................... 438/738; 438/735; 438/736
(58) Field of Search ..................................... 438/585, 652, 438/655, 658, 735, 736, 737, 738

(56) References Cited

U.S. PATENT DOCUMENTS

| | | |
|---|---|---|
| 4,242,156 | 12/1980 | Peel . |
| 4,523,962 | 6/1985 | Nishimura . |
| 4,527,325 | 7/1985 | Geipel, Jr. et al. . |
| 4,557,797 | 12/1985 | Fuller et al. . |
| 4,786,609 | * 11/1988 | Chen ..................................... 438/303 |
| 4,871,689 | 10/1989 | Bergami et al. . |
| 5,126,289 | 6/1992 | Ziger . |
| 5,302,538 | * 4/1994 | Ishikawa et al. ..................... 438/585 |
| 5,412,250 | 5/1995 | Brugge . |
| 5,413,953 | 5/1995 | Chien et al. . |
| 5,441,616 | 8/1995 | Nanda et al. . |
| 5,510,278 | 4/1996 | Nguyen et al. . |
| 5,525,542 | 6/1996 | Maniar et al. . |
| 5,539,249 | 7/1996 | Roman et al. . |
| 5,541,139 | 7/1996 | Rijpers et al. . |
| 5,554,560 | 9/1996 | Hsue et al. . |
| 5,593,725 | 1/1997 | Park et al. . |
| 5,677,111 | * 10/1997 | Ogawa ................................. 430/313 |
| 5,707,883 | * 1/1998 | Tabara ................................. 438/297 |
| 5,747,388 | * 5/1998 | Kusters et al. ........................ 438/723 |
| 5,956,590 | * 9/1999 | Hsieh et al. .......................... 438/303 |
| 5,968,713 | * 10/1999 | Nozaki et al. ....................... 430/326 |
| 6,004,853 | * 12/1999 | Yang et al. .......................... 438/305 |
| 6,037,266 | * 3/2000 | Tao et al. ............................. 438/719 |

OTHER PUBLICATIONS

Dijkstra, Han J., Juffermans, Casper A.H. *Optimization of Anti-Reflection Layers for Deep UV Lithography*, pp. 275–286, 1927 Optical/Lzser Microlithography VI (1993).

Czech, G., Mader, L., Küsters, P. Küppers, Guttmann, A. *Reduction of Linewidth Variation for the Gate Conductor Level by Lithography Based on a New Antireflective Layer*, pp. 51–56, Microelectronic Engineering 21 (1993).

* cited by examiner

Primary Examiner—Stephen D. Meier
Assistant Examiner—Jeff Vockrodt
(74) Attorney, Agent, or Firm—Woodard, Emhardt, Naughton, Moriarty & McNett

(57) ABSTRACT

The present invention relates to semiconductor devices in general, and more particularly to semiconductor devices having anti-reflective coatings to aid in the patterning of a reflective layer thereon to form, for example, a gate electrode. The invention also relates to methods for making a semiconductor having a patterned reflective layer.

30 Claims, 5 Drawing Sheets

SACRIFICIAL MULTILAYER ANTI-REFLECTIVE COATING FOR MOS GATE FORMATION

BACKGROUND OF THE INVENTION

The present invention relates to semiconductor devices in general, and more particularly to semiconductor devices having anti-reflective coatings to aid in the patterning of a reflective layer thereon to form, for example, a gate electrode. The invention also relates to methods for making a semiconductor having a patterned reflective layer.

The semiconductor industry's continuing drive toward integrated circuits with ever decreasing geometries, coupled with its pervasive use of highly reflective materials, such as polysilicon, amorphous silicon, aluminum, and metal silicides, has led to increased photolithographic patterning problems. Unwanted reflections from these underlying reflective materials during the photoresist patterning process often cause the resulting photoresist patterns to be distorted. This problem is further compounded when photolithographic imaging tools used to generate the photoresist patterns utilize deep ultraviolet (DUV) exposure wavelengths (such as approximately 300 nanometers (nm) or less). Although shorter imaging wavelengths bring improved resolution by minimizing diffraction limitations, the resulting patterns generated in the photoresist are often compromised by the effects of unwanted reflections from underlying reflective materials which tend to increase at these shorter wavelengths.

A reflective layer in, for example, a transistor, whether a metal or a semiconductor, must be patterned to define various lines, contacts, gates, etc. within the transistor device. In conventional patterning, a resist layer, such as a photoresist, is deposited on, or over, the reflective layer. A lithography mask (also referred to herein as a "pattern projection mask") having a pattern corresponding to the desired pattern of, for example, the gate electrode is then placed over the substrate. Radiation is transmitted through transparent portions of the pattern projection mask and into the resist layer to thereby alter portions of the resist layer exposed to the radiation. Ideally, only those portions of the resist layer directly beneath the transparent portions of the pattern projection mask will be altered.

Some radiation, however, is transmitted through the resist layer and will be reflected by an underlying reflective layer. The extent of reflection of this radiation is dependent upon the geometry and optical properties of the underlying layer. The radiation reflects back into the resist layer, and in some cases undesirably undercuts the opaque portions of the mask by reflecting into regions other than those directly beneath the transparent portions of the mask.

Upon developing, the resist layer will have a pattern which does not exactly match the lithography mask pattern due to the reflective radiation exposure of portions of the resist layer which should have been protected by opaque portions of the mask, but were not due to this undercutting. The inconsistency in the pattern is then replicated into the device through subsequent processing. In many instances, the replication of an inaccurate resist layer into a reflective layer results in notches in lines formed from the reflective layer. Accordingly, this problem is often referred to as "reflective notching."

Because of the demands on critical dimension and depth of focus control, there have been proposed in the prior art a number of methods for overcoming these patterning problems; however, to date none have proven satisfactory. Perhaps the most widely accepted method is the use of an anti-reflective coating (ARC). Such an ARC is commonly used to aid in the patterning of deep submicron gate electrodes for field effect transistor applications. ARCS are typically placed beneath the photoresist layer and therefore are commonly referred to as bottomside anti-reflective coatings (BARCs). Many types of BARCs have been used in the prior art, including, for example, SiON.

When a BARC is used, for example, in the patterning of a gate electrode, it is placed over the reflective layer, masked with a photoresist, and etched to expose the underlying gate electrode. Another process is then used to finish etching the gate electrode, before or after stripping the photoresist. A problem commonly encountered when ARCs are used in this way is that materials used therein tend to be unstable during furnace exposure and therefore need to be removed before subsequent processing steps may be undergone. Additionally, silicidation of the surface of a polysilicon gate electrode patterned in this way generally requires ARC removal. However, with the sides of the gate electrode and the surface of the gate oxide exposed, removing ARCs is not straightforward. Attempting to remove an ARC with wet chemicals or plasma may lead to damage of the gate or gate oxide.

In view of this background, there is a great need for anti-reflective coatings which are better suited for use in making semiconductor devices due to excellent thermal stability and/or selective removability. Such anti-reflective coatings are provided by the present invention, wherein inventive anti-reflective coatings may be used as sacrificial hardmasks, preferably for field effect transistor gate formation.

SUMMARY OF THE INVENTION

The present invention relates to semiconductor devices in general, and more particularly to semiconductor devices having anti-reflective coatings to aid in the patterning of a reflective layer thereon to form a patterned reflective layer such as, for example, a gate electrode. The invention also relates to methods for making a semiconductor having a patterned reflective layer. While the actual nature of the invention covered herein can only be determined with reference to the claims appended hereto, certain features which are characteristic of the preferred embodiments disclosed herein are described briefly as follows.

In one aspect of the invention, there is provided a method for forming one or more semiconductor devices. A device is formed by first depositing a reflective layer on a semiconductor substrate and then forming a multilayer anti-reflective coating ("ARC") having a first layer and a second layer, wherein the first layer comprises a different composition than the second layer. The first layer of the ARC is positioned between the reflective layer and the second layer. Next, a resist layer is deposited such that the second layer is positioned between the first layer and the resist layer, and selected portions of the resist layer are exposed to electromagnetic radiation. After the resist layer is selectively exposed, it is developed to create a resist mask, the resist mask defining a first region and a second region of the anti-reflective coating and a first region and a second region of the reflective layer. The first region of the anti-reflective coating and the first region of the reflective layer lie between the resist mask and the substrate, and the second region of the anti-reflective coating and the second region of the reflective layer comprise the portions of the layers which do not lie between the resist mask and the substrate. The second region of the ARC is then removed to expose the second region of the reflective layer. Finally, the resist mask, the first region of the second layer and the second region of the reflective layer are removed to produce a patterned reflective layer having a first layer mask thereon.

According to another aspect of the invention, there is provided a method for forming one or more semiconductor devices by first providing a workpiece comprising a semiconductor substrate, a reflective layer, a multilayer anti-reflective coating having a first layer and a second layer, and a resist layer. The reflective layer is positioned between the substrate and the anti-reflective coating, the first layer is positioned between the reflective layer and the second layer, and the second layer is positioned between the first layer and the resist layer. Selected portions of the resist are then exposed to electromagnetic radiation and the resist layer is developed to create a resist mask which defines a first region and a second region of the anti-reflective coating and a first region and a second region of the reflective layer. The first region of the anti-reflective coating and the first region of the reflective layer lie between the resist mask and the substrate and the second region of the anti-reflective coating and the second region of the reflective layer comprise the regions of the layers which do not lie between the resist mask and the substrate. Subsequently the second region of the anti-reflective coating is removed to expose the second region of the reflective layer. Finally, the resist mask, the first region of the second layer and the second region of the reflective layer are removed to produce a semiconductor device having a patterned reflective layer with a first layer mask thereon. In a preferred aspect of the invention, the first layer comprises a different composition than the second layer.

According to another aspect of the invention, there is provided a method for forming a gate electrode on a semiconductor device by first depositing an amorphous silicon reflective layer on a semiconductor substrate; depositing a first layer comprising silicon dioxide and a second layer comprising a SiON layer on the reflective layer to reduce reflections of electromagnetic radiation such that the first layer is positioned between the reflective layer and the second layer. A resist layer is then deposited such that the second layer is positioned between the first layer and the resist layer and selected portions of the resist layer are exposed to electromagnetic radiation. The resist layer is then developed to create a resist mask, the resist mask defining protected and unprotected regions of the first and second layers.

Unprotected regions of the first and second layers are removed to define protected and unprotected regions of the reflective layer and then the resist mask, the first region of the second layer and the second region of the reflective layer are removed to produce a transistor gate electrode having a silicon dioxide layer thereon.

In another aspect of the invention, there is provided a method for forming one or more semiconductor devices which includes (1) depositing a reflective layer on a semiconductor substrate; (2) forming a multilayer anti-reflective coating having a first layer and a second layer, the first layer being positioned between the reflective layer and the second layer; (3) forming a lithographically-patterned resist mask such that the second layer is positioned between the first layer and the resist mask, thereby defining a first region and a second region of the anti-reflective coating and a first region and a second region of the reflective layer; wherein the first region of the anti-reflective coating and the first region of the reflective layer lie between the resist mask and the substrate and wherein the second region of the anti-reflective coating and the second region of the reflective layer comprise the regions of the layers which do not lie between the resist mask and the substrate; (4) removing the second region of the anti-reflective coating to expose the second region of the reflective layer; and (5) removing the resist mask, the first region of the second layer and the second region of the reflective layer to produce a semiconductor device having a patterned reflective layer with a first layer mask thereon; wherein the first layer comprises a different composition than the second layer.

According to another aspect of the invention, there is provided a workpiece for making a semiconductor device comprising a semiconductor substrate; an unpatterned reflective layer; a multilayer anti-reflective coating formed such that the reflective layer lies substantially between the substrate and the anti-reflective coating. The device also comprises a resist layer formed such that the anti-reflective coating lies substantially between the reflective layer and the resist layer. The multilayer ARC comprises a first layer and a second layer, the first layer being formed between the reflective layer and the second layer, and the second layer being formed between the first layer and the resist layer. The first layer may be removed without damage to the reflective layer and may be selectively etched with regard to the reflective layer under appropriate etch conditions.

It is an object of the invention to provide improved methods of making a semiconductor device wherein process layers used to pattern a reflective layer on the device may be removed from the patterned reflective layer without substantially damaging the patterned reflective layer.

It is another object of the invention to provide a workpiece for making a semiconductor device, such as, for example, a transistor, wherein pattern distortion is substantially prevented by the presence of a multilayer anti-reflective coating ("ARC"), the multilayer ARC being readily removed from the patterned reflective layer.

Further objects, features, and advantages of the present invention shall become apparent from the detailed drawings and descriptions provided herein.

BRIEF DESCRIPTION OF THE FIGURES

The following brief descriptions are intended to facilitate an understanding of the Figures forming a part hereof and are not intended to be limiting of the invention.

FIG. 1 is a partial cross sectional view of a semiconductor device comprising a semiconductor substrate 25; a dielectric layer 11; a reflective layer 12; a multilayer anti-reflective coating 17 comprising a first layer 13 and a second layer 14; and a resist layer 15.

FIG. 3 is a partial cross sectional view of a semiconductor device as shown in FIG. 1, wherein the reflective layer is an amorphous silicon layer 112, wherein the first layer is a silicon dioxide layer 113 and wherein the second layer is a SiON layer 114.

FIG. 4 schematically illustrates a semiconductor device such as that depicted in FIG. 3, wherein a pattern projection mask having opaque portions and transparent portions is oriented in such a way that radiation passing through transparent portions of the pattern projection mask will chemically alter specific portions of the resist layer.

FIG. 5 depicts a semiconductor device after selected portions of the resist layer have been exposed to radiation and developed, the device therefore having a patterned resist mask 16 which defines a first region of the amorphous silicon layer 145, a first region of the silicon dioxide layer 143, a first region of the SiON layer 141, a second region of the amorphous silicon layer 146, a second region of the silicon dioxide layer 144 and a second region of the SiON layer 142.

FIG. 6 depicts a semiconductor device as set forth in FIG. 5 wherein the second region 144 of the silicon dioxide layer and the second region 142 of the SiON layer (i.e., the unprotected regions of the anti-reflective coating) have been etched.

FIG. 7 depicts a semiconductor device as set forth in FIG. 6 after the resist mask has been stripped from the device.

FIG. 8 depicts a semiconductor device as set forth in FIG. 7 after the first region 142 of the SiON layer has been etched, with partial etching of the second region 146 of the amorphous silicon layer.

FIG. 9 depicts a semiconductor device as set forth in FIG. 8 after the second region 146 of the amorphous silicon layer has been etched, resulting in a patterned amorphous silicon layer 145 having a first layer mask 143 thereon.

FIG. 10 depicts a semiconductor device as set forth in FIG. 9, wherein the first region 143 of the silicon dioxide layer has been removed and the patterned amorphous silicon layer 145 (i.e., the gate electrode) has formed thereon a silicide layer 150.

DESCRIPTION OF THE PREFERRED EMBODIMENTS

Figure 1:
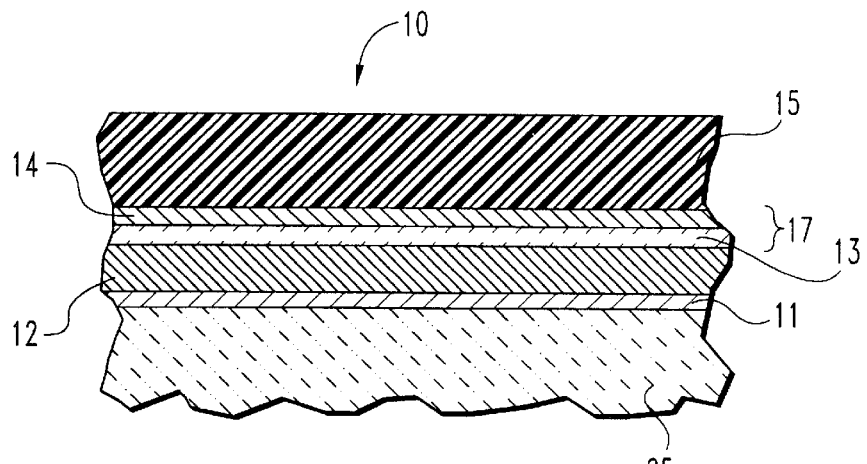
FIGS. 1 and 3–10 correspond to various processing stages of a semiconductor device in accordance with the present invention; and are not shown to scale to enhance clarity.

For the purposes of promoting an understanding of the principles of the invention, reference will now be made to the embodiments described herein and illustrated in the drawings, and specific language will be used to describe the same. It will nevertheless be understood that no limitation of the scope of the invention is thereby intended, any alterations and further modifications in the illustrated devices and methods, and any further applications of the principles of the invention as illustrated therein being contemplated as would normally occur to one skilled in the art to which the invention relates.

The present invention relates to a semiconductor device having a multilayer anti-reflective coating ("ARC"), this ARC providing advantageous features in the patterning of a reflective layer thereon to form, for example, a gate electrode. To clarify the description, reference is first made to FIG. 1, in which numeral 25 identifies the semiconductor substrate of a semiconductor device. Numeral 12 identifies a reflective layer such as, for example, an amorphous silicon layer or a polycrystalline silicon layer. Numeral 17 identifies a multilayer ARC which includes a first layer 13 such as, for example, a silicon dioxide layer and a second layer 14 such as, for example, an SiON layer or an SiN layer. Numeral 15 identifies the resist layer of the device. The use of inventive multilayer ARCs provides distinct advantages in inventive processes over the prior art because the first layer 13 (i.e. the layer of the ARC 17 closer to the reflective layer 12) provides a protective, buffering function. Namely, as described in greater detail herein, the presence of the first layer 13 enables the removal of the second layer 14 during certain processing steps, without damaging the underlying patterned reflective layer. Additionally, the first layer has a compositional make-up which allows it to be selectively removed from the underlying reflective layer without causing damage thereto. Thus, the ARC may be removed in accordance with the invention much more readily from reflective layer 12. An inventive multilayer ARC provides a hardmask function for etch patterning of the reflective layer.

An ARC is advantageously placed between a resist layer and a reflective layer to minimize reflectivity of the reflective layer during photolithography. The ARC reduces distorted patterning of the reflective layer by minimizing unwanted radiation reflection during photolithography operations which utilize, for example, deep ultraviolet (DUV) radiation. DUV radiation in semiconductor manufacturing refers to radiation having wavelengths less than about 300 nanometers (nm). For example, wavelengths of 248 nm are particularly preferred, as compared to G-line (436 nm), H-line (405 nm), or I-line (365 nm) lithography.

The invention overcomes several problems in the prior art associated with using ARCs in photolithographic patterning processes. Perhaps the most significant problem that is overcome relates to the difficulties which have previously been encountered in removing an ARC, such as, for example, SiON, from an underlying reflective layer, either during or after patterning the reflective layer, without damaging the reflective layer. The invention overcomes this problem by providing an advantageous multilayer ARC and methods for making a semiconductor device using a multilayer ARC.

Another advantage of an inventive multilayer ARC is that the thickness of the layers thereof may be optimized in accordance with the invention, as a function of the optical properties of the selected compositions, to provide surprisingly advantageous absorbance (low transmittance and low reflectance) of radiation in the DUV range of the spectrum by the multilayer ARC. Optimum thicknesses may be determined, for example, using a commercial PROLTTH/2 computer program, available from FINLE Technologies, Inc., P.O. Box 162712, Austin, Tex. 78716 USA. This program, upon inputing the optical properties "n" and "k" for each layer composition in the multilayer ARC and the wavelength of the exposure radiation, computes a "substrate reflectivity" value for each combination of layer thicknesses computed ("n" represents the real part of the index of refraction and "k" represents the imaginary part of the index of refraction). As such, a thickness combination having a low (preferably zero) substrate reflectivity value is preferably selected for use according to the present invention. It is also important that the first layer have a sufficient thickness that it will protect the underlying layer when an etch is used to remove the overlying second layer.

Figure 2:
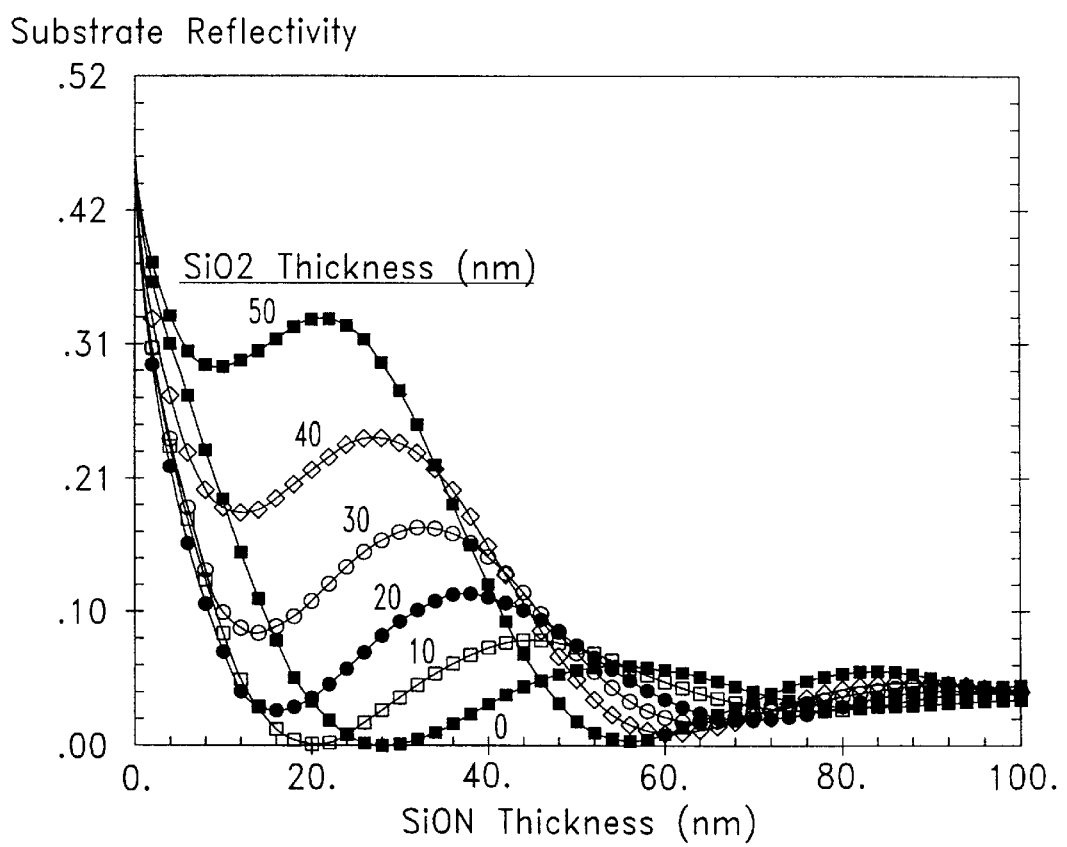
FIG. 2 is a plot of substrate reflectivity versus SiON thickness, each curve representing the substrate reflectivity where the silicon dioxide layer has a given thickness. Further, the results indicated are based upon the SiON layer having the following optical properties: n=2.1 and k=0.7, and the silicon dioxide layer having the following optical properties: n=1.5 and k=0.0.

As an example, in a preferred aspect of the invention, the first layer in an inventive multilayer anti-reflective coating is silicon dioxide having the following optical properties: n=1.5 and k=0.0; and the second layer is SiON having the following optical properties: n=2.1 and k=0.7. As is seen in the plot of FIG. 2, at an exposure wavelength of 248 nanometers, where the silicon dioxide is about 100 angstroms (10 nanometers) thick, the SiON is preferably about 200 angstroms (20 nanometers) thick. Alternatively, where the silicon dioxide is about 500 angstroms (50 nanometers) thick, the SiON is preferably about 550 angstroms (55 nanometers) thick. As is readily understood by a skilled artisan, the desired thicknesses for various applications may differ for various reasons; however, optimization as taught herein will provide an optimal combination with respect to specific materials selected for use as first and second layers according to the present invention. Optical properties as discussed above may be determined for a particular composition by techniques well known in the art. Additionally, optical properties of a given composition may be altered by modifications known in the art.

Brief Overview of Inventive Processing Techniques

Important features and advantages of the present invention will be more clearly understood from the following description taken in conjunction with the accompanying drawings. It is important to point out that the illustrations are not necessarily drawn to scale, and that there may be other embodiments of the present invention which are not specifically illustrated.

In one aspect, the present invention provides a method for making a semiconductor device, such as, for example, a transistor, the method utilizing a multilayer ARC 17 having a first layer 13 and a second layer 14, wherein the first layer 13 (also referred to herein as "separating layer," "protective layer" and "buffer layer") lies between the reflective layer 12 and the second layer 14. It is critical to the invention that exposed regions of the second layer are removable without damaging or disfiguring the "underlying" reflective layer pattern, such as, for example, a gate electrode. The first layer 13 therefore possesses properties and has a thickness such that the second layer 14 may be removed therefrom under etch conditions that do not penetrate through the first layer and, therefore, do not damage the patterned reflective layer. It is also important that the separating layer 13 be removable from the underlying reflective layer so that the separating layer may be removed therefrom after patterning without damaging the patterned reflective layer. As such, the specific material to be utilized as the separating layer and the dimensions thereof are determined such that the second layer may be removed therefrom under etch conditions which will not penetrate through the separating layer and, therefore, will not damage the underlying gate electrode. The advantageous presence of the separating layer make an inventive multilayer ARC extremely useful as a sacrificial ARC in view of difficulties in the prior art relating to removal of an ARC from an underlying reflective layer.

In accordance with a preferred aspect of the invention, a semiconductor workpiece 10 is provided, as is depicted in FIG. 1, which comprises a semiconductor substrate 25, a reflective layer 12, a multilayer ARC 17 and a resist layer 15. Preferably, the workpiece 10 is formed by depositing a reflective layer on a semiconductor substrate; forming thereon a multilayer ARC; and depositing thereon a resist layer. The multilayer ARC has a first layer 13 and a second layer 14, the first layer 13 being positioned between the reflective layer 12 and the second layer 14, and the second layer 14 being positioned between the first layer 13 and the resist layer 15. In accordance with the preferred embodiment depicted in FIG. 3, the reflective layer 12 is an amorphous silicon layer 112, the first layer 13 is a silicon dioxide layer 113 and the second layer 14 is a SiON layer 114. It is understood that the reflective layer 12 may alternatively comprise other materials having properties which allow advantageous processing in accordance with the invention, such as, for example, polycrystalline silicon, and that the second layer 14 may alternatively comprise other materials having properties which allow advantageous processing in accordance with the invention, such as, for example, SiN; however, for purposes of describing and illustrating inventive methods, a device made of the above-named specific compositions will be described in greater detail.

Figure 3:
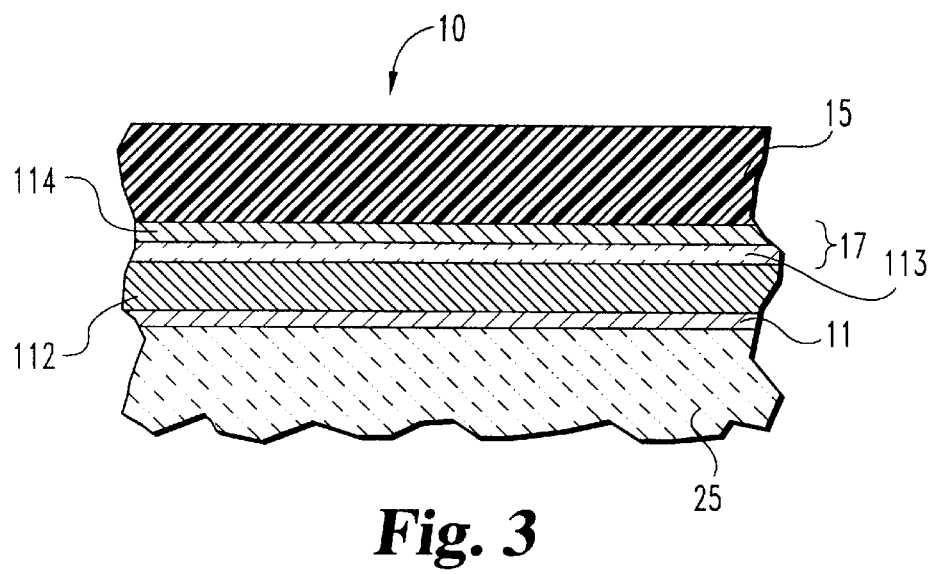
Figure 4:
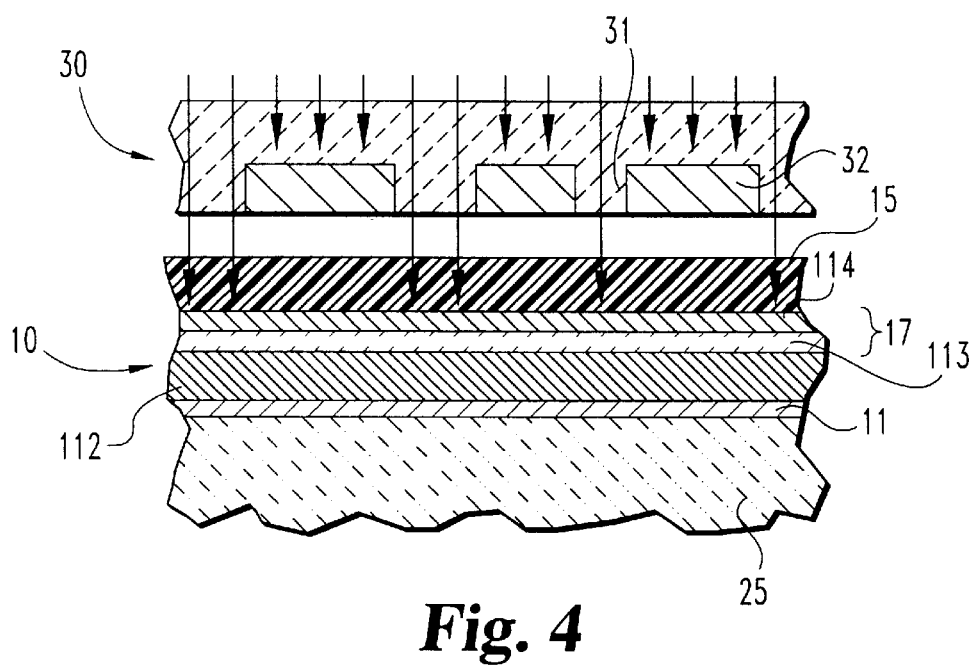
Figure 5:
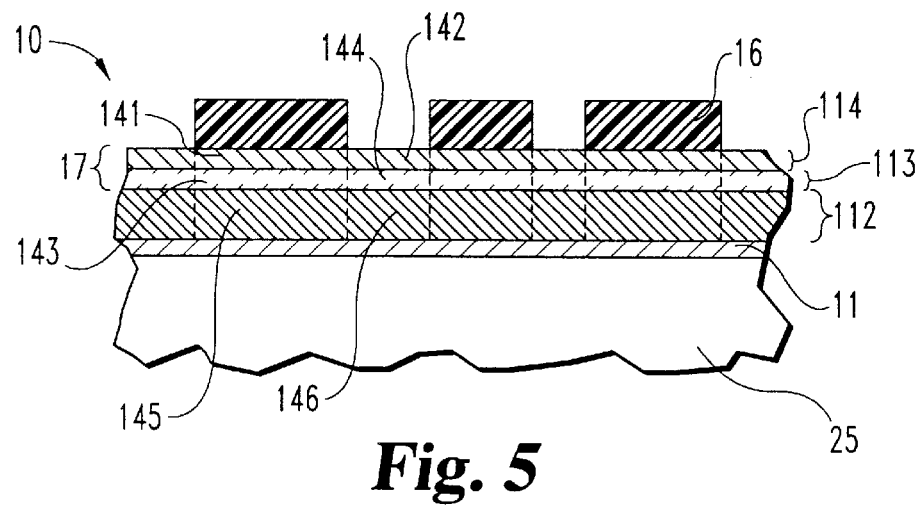

After a workpiece 10 is prepared or otherwise provided as described in the processing stage shown in FIG. 3, selected portions of the resist layer 15 are exposed to electromagnetic radiation in a subsequent stage, as depicted in FIG. 4, through a pattern projection mask having opaque portions 32 and transparent portions 31. The resist layer 15 is developed in the next processing stage to create a resist mask 16, as shown in FIG. 5, the resist mask 16 being configured in a pattern corresponding, for example, to the desired gate electrode. The resist mask 16 defines first and second regions of the multilayered ARC 17 and first and second regions of the reflective layer 112. The first region 143 of the silicon dioxide layer 113, the first region 141 of the SiON layer 114 and the first region 145 of the amorphous silicon layer 112 lie between the resist mask and the substrate. The second region 144 of the silicon dioxide layer 113, the second region 142 of the SION layer 114 and the second region 146 of the amorphous silicon layer 112 do not lie between the resist mask and the substrate. In other words, the second regions are "unprotected" with regard to the resist mask. Exposure of selected portions of the resist to electromagnetic radiation and development of the resist may be accomplished using techniques known in the art.

Figure 6:
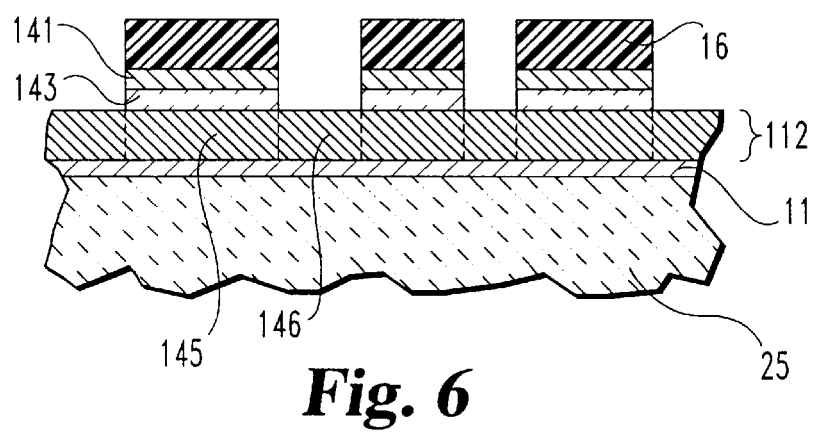

A workpiece having a patterned resist mask formed thereon in a predetermined pattern is then processed in accordance with the invention by removing the second regions 142, 144 of the silicon dioxide and SiON layers of the multilayer ARC 17 to expose the second region 146 of the amorphous silicon layer 112, as shown in FIG. 6. The removal of the second regions 142, 144 of the ARC layers is preferably accomplished by plasma etching. Etch conditions used to remove the second regions of the ARC layers, discussed in greater detail below, may also remove a portion of the second region 146 of the reflective layer 12 after penetrating through the ARC, which is acceptable because the second region 146 of the reflective layer is to be removed by subsequent processing.

Figure 9:
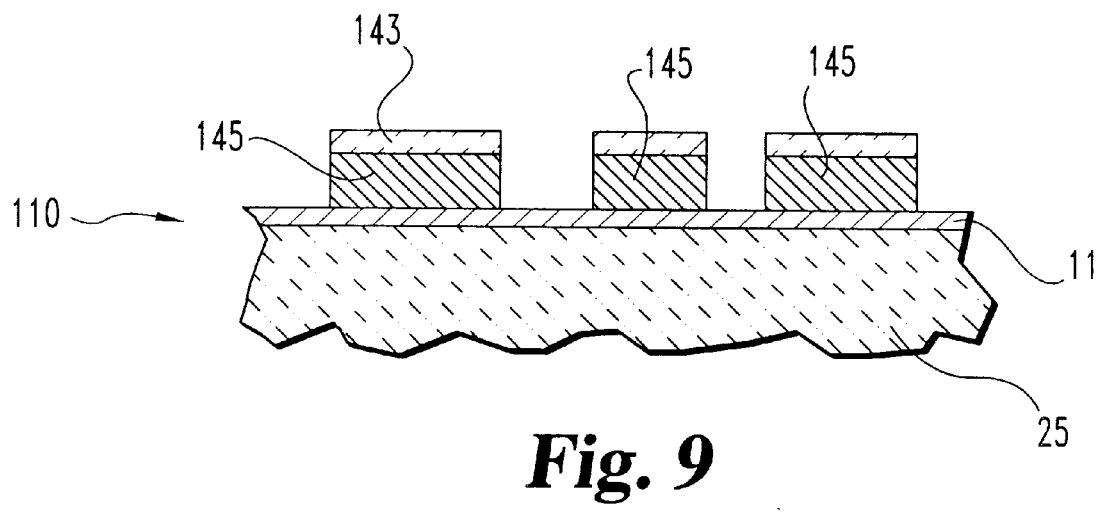

After the second regions 142, 144 of the ARC layers 17 are removed, the resist mask 16, the second region 146 of the amorphous silicon layer 112 and the first region 141 of the SiON layer 114 are removed to produce a semiconductor device 110 having a patterned reflective layer with a first layer mask thereon, as shown in FIG. 9. In a preferred aspect of practicing the invention, this is done by first removing the resist mask 16, and subsequently removing the first region 141 of the SiON layer 114, and then the second region 146 of the amorphous silicon layer 112.

Once the above processing has been performed, the device 110 preferably has a configuration substantially as shown in FIG. 9 and comprises a patterned reflective layer defining, for example, a gate electrode 145, having a silicon dioxide layer mask 143 remaining thereon (i.e., at least a portion of the first region 143 of the first layer 113 remains on the patterned reflective layer 145). In this embodiment, the silicon dioxide layer mask 143 may therefore be removed from the underlying gate electrode 145 using methods known in the art without causing substantial damage to the gate electrode 145. Alternatively, since silicon dioxide is a heat stable dielectric material, it may be allowed to remain on the patterned reflective layer after formation thereof if no additional treatment to the patterned reflective layer is desired in a particular manufacturing process.

Detailed Description of the Preferred Embodiments

FIGS. 4–9 illustrate, in cross-section, process steps in accordance with one embodiment of the invention, wherein an integrated circuit pattern is formed from a reflective layer on a portion of a semiconductor substrate (such as a wafer). It is important to note that, according to the present invention, there may be additional layers between the reflective layer and the semiconductor substrate. Shown in FIG. 1 is a semiconductor device 10, such as an integrated circuit, (also termed "workpiece" herein). Device 10 includes a semiconductor substrate 25, a dielectric layer 11 overlying an active region of the semiconductor substrate 25, and a reflective layer 12 overlying dielectric layer 11. Semiconductor substrate 25 can be a single crystal silicon substrate, silicon on insulator (SOI) substrate, a gallium arsenide substrate, or the like. Dielectric layer 11 can be thermally grown silicon dioxide, doped silicon dioxides undoped silicon dioxide, oxynitride, silicon nitride, or the like, and may be formed using conventional deposition or oxidation techniques.

Reflective layer 12 in one form is polycrystalline or amorphous silicon or other reflective or semireflective material used to form individual active devices, such as transistors or resistors, within device 10. In its polysilicon form, it is often desired that reflective layer 12 be between substrate 25 and overlying interconnect layers, such as dielectric layers patterned with metal wiring connections. If reflective layer 12 is polysilicon or amorphous silicon, dielectric layer 11 can be a gate oxide or gate dielectric layer, in which case dielectric layer 11 may preferably be much thinner than if reflective layer were aluminum or other metal used for interconnects.

In another form, reflective layer 12 is formed of aluminum, copper, tungsten, gold, silver, platinum, or other metallic material used in a semiconductor device. In still other forms, reflective layer 12 may be another conductive material such as a silicide, polycide or doped polysilicon used to provide device wiring. Reflective layer 12 may include underlying or overlying barrier and/or adhesion layers (not shown), such as titanium, titanium silicide, titanium nitride, tungsten, tungsten silicide, and the like. In its metal form, reflective layer 12 will eventually be lithographically patterned to form metal interconnects within the device 10. Accordingly, there is likely to be various intervening layers and structures between reflective layer 12, dielectric layer 11, and substrate 25, such as, for instance, amorphous silicon layers for transistor gates, contacts, reflective plugs, interlayer dielectrics, and the like. However, such intervening elements are not shown to enhance clarity.

In light of the fact that reflective layer 12 can be made of either a conductive material (e.g. a metal) or a semiconductive material (e.g. amorphous silicon), a clarification of terminology used herein will be helpful. As used henceforth for the sake of simplicity, "reflective" should be interpreted to refer to materials which reflect radiation utilized to pattern the devices, where such reflection may cause pattern distortion, misalignment, or other undesirable patterning result. Reflective materials are commonly used to make structures for transmitting electrical signals in semiconductor devices, including materials commonly referred to as "semiconductive" materials, as well as metals, metal alloys, and refractory metal suicides.

In a preferred embodiment, the reflective layer comprises amorphous silicon, the first layer of the ARC comprises silicon dioxide and the second layer of the ARC comprises SiON. As used with regard to the above-described preferred embodiment, the term "silicon dioxide" is intended to have its accepted meaning in the field of semiconductor device fabrication. Briefly, "silicon dioxide" refers to a composition comprising silicon and oxygen which achieves the advantageous result when placed between an amorphous silicon layer and a SiON layer in accordance with the invention. It is not intended that the term be limited to a stoichiometric ratio or even to compositions comprising only silicon and oxygen. It is well known in the relevant field that a silicon dioxide layer formed using various deposition techniques is an amorphous film which may include additional components therein. It is intended that the present invention include such impure oxide layers, as well as layers having various amounts of silicon dioxide therein, and these are included within the meaning of the term "silicon dioxide" as used herein.

The term "SiON" is intended to refer to a material comprising silicon, oxygen and nitrogen. It is not intended that the term "SiON" be limited to a stoichiometric ratio or even to compositions comprising only silicon, oxygen and nitrogen. Hydrogen is also potentially present in SiON material, as well as additional elements which may become included during the formation of the SiON layer. In a preferred aspect of the invention, the SiON material comprises from about 40 to about 60 mole percent silicon, from about 20 to about 40 mole percent oxygen, from about 4 to about 20 mole percent nitrogen and less than about 20 mole percent hydrogen. More preferably, it comprises from about 45 to about 55 mole percent silicon, from about 25 to about 35 mole percent oxygen, from about 6 to about 18 mole percent nitrogen and less than about 15 mole percent hydrogen. It is understood that the elemental composition of SiON material may change upon further processing. For example, SiON may change form when exposed to high temperatures during furnace processing. Therefore, the use of the term SiON in the present description refers to the material at the time the SION layer is formed on the device.

"Amorphous silicon," as used herein, is also intended to have its accepted meaning in the field of semiconductor device fabrication. Additionally, it is known that amorphous silicon may change form upon further processing. Specifically, upon subsequent heating, it is expected that the amorphous silicon, formed upon a semiconductor device according to the present invention may be transformed into polysilicon. In recognition of this phenomenon, it is intended according to the present invention, that the discussions herein regarding an amorphous silicon layer encompass devices in which this layer is converted into polysilicon.

It is not intended that the present invention be limited to the compositions set forth above, but include alternate compositions having properties which make them acceptable substituted for specific compositions named herein. As such, the compositions set forth above are simply named as examples of compositions which may be advantageously used in accordance with the invention. It is readily understood by a skilled artisan that, with minimal experimentation, materials may be selected for use in multilayer ARCs of the invention based upon etch properties and upon optical properties of the materials as described herein. These properties are readily ascertainable using techniques known in the art. It is specifically contemplated that amorphous silicon may be advantageously replaced with polysilicon and/or that SiON may be advantageously substituted with SiN.

In making a semiconductor device 110 according to the present invention, a workpiece as shown in FIG. 3 is provided by first placing a dielectric layer 11 over a semiconductor substrate 25 and depositing an amorphous silicon layer 112 over the dielectric layer 11. It is understood that there may be intervening layers between layers specifically named herein without departing from the spirit and scope of the present invention. The dielectric layer 11 preferably has a thickness of from about 15 to about 1000 angstroms; more preferably from about 20 to about 200 angstroms; and most preferably about 50 angstroms. The amorphous silicon layer 112 is preferably between about 1500 angstroms and about 3500 angstroms thick; more preferably, between about 2000 and about 3000 angstroms thick, and most preferably about 2500 angstroms.

Next, a multilayer anti-reflective coating 17 (ARC) is formed on the amorphous silicon layer 112 by first depositing a silicon dioxide layer 113 on the amorphous silicon layer 112, and then depositing a layer of SiON 114 on the silicon dioxide layer 113. Formation of these layers may be accomplished according to a variety of techniques well known in the art. For example, the silicon dioxide layer 113 may be formed by a thermal process which consumes amorphous silicon. Preferably the SiON layer 114 is deposited using plasma-enhanced chemical vapor deposition (PECVD). Subsequently, a photoresist layer 15 is formed on the ARC 17 such that the SION layer 114 lies between the silicon dioxide layer 113 and the photoresist layer 15.

Thicknesses at which the silicon dioxide layer 113 and the SiON layer 114 may advantageously be deposited can be selected, as described above, based upon an optimization calculation which depends upon the optical properties of the specific silicon dioxide material and the specific SiON material and the predetermined wavelength of radiation which is to be utilized for the specific photolithographic processing. Additionally, the optical properties of the subject materials may be altered using techniques known in the art. When the silicon dioxide has the following optical properties: n=1.5 and k=0.0; when the SiON has the following optical properties: n=2.1 and k=0.7; and when the radiation to be used has a wavelength of 248 nm; the absorption of the ARC may be optimized at a plurality of oxide layer and SiON layer thicknesses.

In one preferred embodiment, the multilayer ARC 17 comprises a silicon dioxide layer 113 having a thickness of from about 75 to about 125 angstroms, and a SiON layer 114 having a thickness of from about 175 to about 225 angstroms. More preferably, the thickness of the silicon dioxide layer 113 is from about 90 to about 110 angstroms and the thickness of the SiON layer 114 is from about 190 to about 210 angstroms. Most preferably, the silicon dioxide layer 113 has a thickness of about 100 angstroms and the SiON layer 114 has a thickness of about 200 angstroms.

In an alternate embodiment, the multilayer anti-reflective coating 17 comprises a silicon dioxide layer 113 having a thickness of from about 475 to about 525 angstroms, and a SiON layer 114 having a thickness of from about 525 to about 575 angstroms. More preferably, the thickness of the silicon dioxide layer 113 is from about 490 to about 510 angstroms and the thickness of the SiON layer 114 is from about 540 to about 560 angstroms. Most preferably, the silicon dioxide layer 113 has a thickness of about 500 angstroms and the SiON layer 114 has a thickness of about 550 angstroms.

A transistor device is made from the workpiece by first patterning the photoresist layer to provide a shape corresponding to the desired shape of the gate electrode. This is accomplished by affixing a pattern-projection mask 30 above the photoresist layer 15, as is shown in FIG. 4. The pattern-projection mask 30 comprises transparent portions 31 and opaque portions 32, and is positioned such that radiation (depicted by arrows in FIG. 4) contacts the photoreslst layer 15 only in certain, specifically-selected areas. The opaque portions are used to block radiation, so that radiation only passes through the pattern-projection mask in unobstructed transparent regions. For instance, radiation waves as shown in FIG. 4 are blocked by opaque portions, but are elsewhere free to pass through transparent portion to resist layer. In a preferred form of the invention, radiation waves are ultraviolet radiation waves having wavelengths less than 300 nanometers. Particularly, the invention is well suited for use with a wavelength at approximately 248 nanometers. Wavelengths under 300 nanometers are especially effective for use with the present invention because a multilayer ARC comprising a silicon dioxide layer 113 and a SiON layer 114 is particularly absorptive at these shorter wavelengths. Thus, upon passing through the resist layer, radiation waves are absorbed by the ARC, rather than being transmitted through the ARC and reflected by the reflective layer.

Upon exposing selected portions of the resist layer to radiation waves, these portions of the resist layer undergo chemical changes such as photo-acid generation which may, for example, either react with a host polymer via cross-linking reaction to form negative patterns or via deprotenation reactions to form positive patterns. As a result, the resist layer can be developed in an alkaline solution to remove either the exposed portions of the resist layer (called positive imaging) or the unexposed portions of the resist layer (called negative imaging). Both imaging techniques are well-known in the art, therefore further discussion is not necessary. An example of positive imaging is shown in FIGS. 4 and 5, wherein portions of the resist layer exposed to radiation waves in FIG. 4 are removed after the developing operation. The remaining portions of resist layer form a patterned resist mask 16 as shown in FIG. 5. Once the resist mask 16 is defined as a result of developing, the device is processed to transfer the resist mask pattern into underlying layers, specifically into the ARC and the reflective layer. During such processing, the resist mask protects regions of the ARC and the reflective layer directly between the resist mask 16 and the substrate 25 (the "first regions") from the etch, as is shown in FIG. 5.

With the patterned mask in place, the device 10 is exposed to etch conditions which remove the second region 142 of the SiON layer 114 and the second region 144 of the oxide separating layer 113, thereby patterning the multilayer ARC to a pattern corresponding to the resist mask, as is shown in FIG. 6. As stated above, this etch may also remove part of the second region 146 of the amorphous silicon layer 112, this occurrence being acceptable since this region of amorphous silicon will be removed in subsequent etch steps. An example of an etch environment useful in this etching step is described in greater detail in Example 3.

Figure 7:
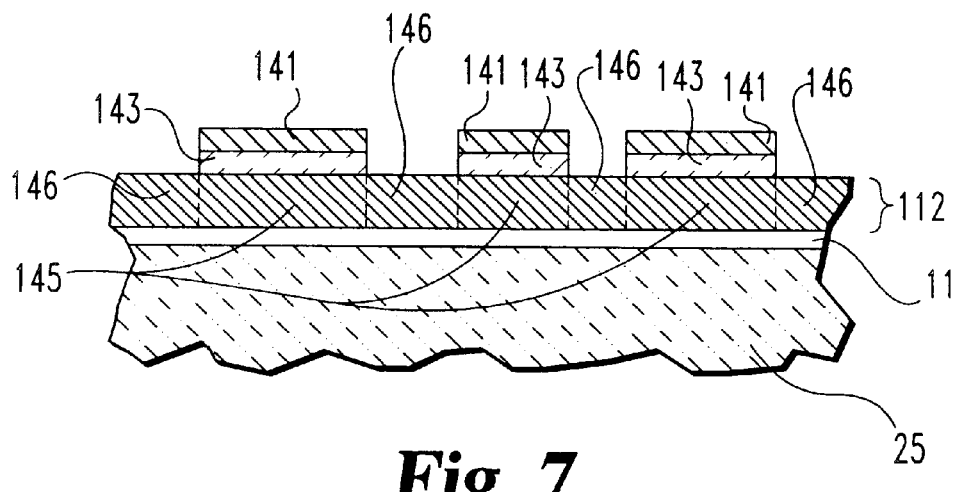
Figure 8:
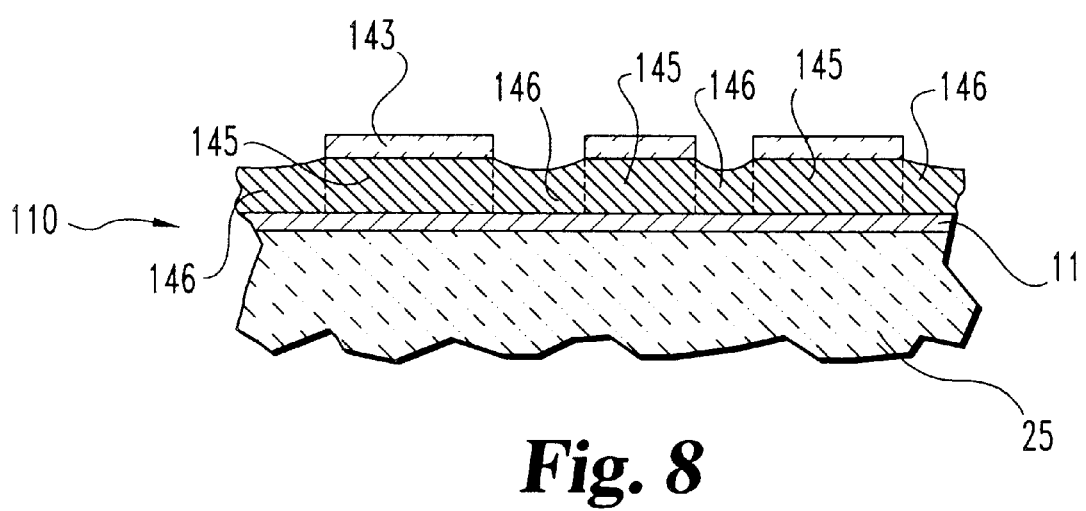

After the ARC is patterned, with the first region 143 of the oxide separating layer 113 and the first region 141 of the SiON layer 114 remaining in place, the resist mask 16, the first region 141 of the SiON layer 114 and the second region 146 of the amorphous silicon layer 112 are removed to produce a gate electrode having a silicon dioxide layer mask thereon. In one manner of accomplishing this result, the photoresist mask is removed removed., or stripped, using one of a wide variety of techniques known in the art to uncover the first region 141 of the SiON layer 114 as depicted in FIG. 7.

Next, the second region 146 of the amorphous silicon layer 112 and the first region 141 of the SiON 114 are removed. Upon completion of this etching step, the device has formed thereon a patterned reflective layer having an oxide mask thereon, as depicted in FIG. 9. In a preferred aspect of the invention, this is accomplished by first removing the first region 141 of the SiON layer. This removal may be advantageously performed in accordance with the method set forth in Example 3, wherein etch conditions are described whereby SiON material is etched at a rate of about 15 angstroms per second, $SiO_2$ is etched at a rate of about 15 angstroms per second, and amorphous silicon is etched at a rate of about 20 angstroms per second. Although these etch conditions will also etch into the exposed amorphous silicon (i.e., the second region 146 of the amorphous silicon layer) and may also remove part of the first region 143 of the silicon dioxide separating layer, this is acceptable so long as the silicon dioxide layer is sufficiently thick that the etch does not penetrated through the silicon dioxide layer.

Once the SiON is removed as described above, the remainder of the second region 146 of the amorphous silicon layer is removed using etch conditions having selectivity between amorphous silicon and silicon dioxide (i.e., which etches the former without substantially etching the latter). This etching may advantageously be performed as described in Example 3, wherein etch conditions are described whereby amorphous silicon is etched at a rate of about 20 angstroms per second and silicon dioxide is etched at a rate of about 1 angstrom per second.

Furthermore, one may use an etch recipe having a lesser selectivity between amorphous silicon and silicon dioxide as a bulk etch, or an etch recipe having a higher selectivity as an overetch. Under certain overetch conditions, set forth in Example 3, amorphous silicon is etched at a rate of about 10 angstroms per second and silicon dioxide is etched at a rate of about 0.1 angstrom per second. As the silicon dioxide layer is not penetrated in either etch, the resulting semiconductor device has a patterned gate electrode having a silicon dioxide layer thereon.

Figure 10:
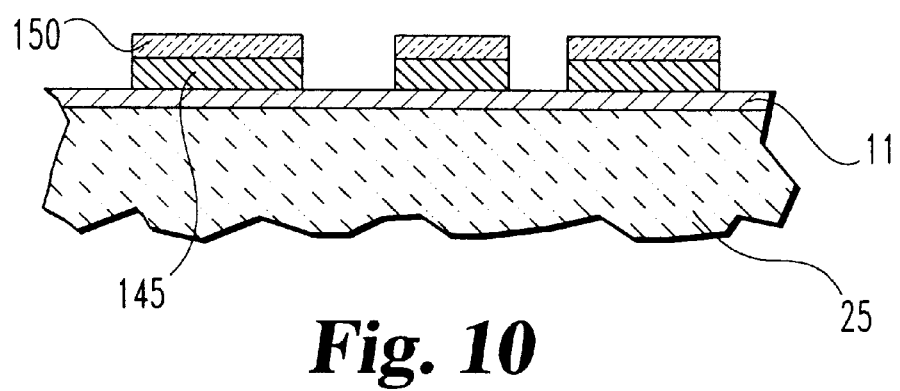

Once a semiconductor device 110 is produced having a gate electrode 145 with a silicon dioxide mask 143 thereon, the oxide layer 143 need not be removed from the gate in further processing steps since it is stable under conditions typically used in fabrication processes of the relevant field. However, if it is desired that the oxide layer 143 be removed from the gate electrode 145, for example, so that it may be silicided to form a gate electrode 145 having a silicide layer 150 thereon, the oxide layer 143 is readily removed in a lightly-doped drain (LDD) spacer oxide etch, as described in Example 4. A device is shown in FIG. 10 from which the oxide layer 143 has been removed and in which the gate electrode 145 has been silicided to form a silicide layer 150. The present invention, therefore, provides an improved manner of forming patterned reflective layers, such as gate electrodes, in a transistor by utilizing an inventive multilayer ARC.

The invention will be further described with reference to the following specific Examples. It will be understood that these Examples are illustrative and not restrictive in nature.

EXAMPLE ONE

MAKING A WORKPIECE HAVING AN ANTI-REFLECTIVE COATING AND A RESIST LAYER THEREON

A workpiece is provided by first providing a semiconductor substrate and placing a dielectric layer over the substrate. The dielectric layer is formed over the substrate by thermal oxidation. The dielectric layer is deposited at a thickness of from about 15 to about 1000 angstroms; more preferably from about 20 to about 200 angstroms; and most preferably about 50 angstroms.

Next, an amorphous silicon layer is deposited on the dielectric layer. The amorphous silicon layer is preferably deposited by chemical vapor deposition ("CVD"). The amorphous silicon layer is preferably deposited to between about 1500 angstroms and about 3500 angstroms thick; more preferably, between about 2000 and about 3000 angstroms thick, and most preferably about 2500 angstroms.

Next, a multilayer anti-reflective coating ("ARC") is formed on the amorphous silicon layer by first depositing a silicon dioxide separating layer on the amorphous silicon layer, and then depositing a layer of SiON on the silicon dioxide layer. Preferably, the silicon dioxide separating layer is deposited on the amorphous silicon layer by plasma-enhanced chemical vapor deposition ("PECVD"). The silicon dioxide separating layer is deposited at a thickness of about 500 angstroms. The SiON layer is preferably deposited on the silicon dioxide layer using PECVD. The SiON layer is deposited at a thickness of about 550 angstroms.

Subsequently, a photoresist layer is coated on the ARC such that the SiON layer lies between the silicon dioxide layer and the photoresist layer. The photoresist layer is coated by spin-on coating and has a thickness of from about 0.5 microns to about 1 micron.

EXAMPLE TWO

EXPOSING AND DEVELOPING THE RESIST LAYER TO MAKE A RESIST MASK

A transistor device is made from a workpiece having a multilayer ARC and a photoresist layer thereon, such as, for example, the device made according to Example 1, by first patterning the photoresist layer to provide a patterned resist mask corresponding to the desired pattern of the ultimate gate electrode. This is accomplished by affixing a pattern-projection mask above the photoresist layer, the pattern-projection mask comprising transparent portions and opaque portions, such that radiation passing through the transparent portions contacts the photoresist layer only in certain areas. Radiation waves are ultraviolet radiation waves having wavelengths less than 300 nanometers, more preferably, the radiation waves have wavelengths of approximately 248 nanometers.

After exposure, the resist layer is developed in an alkaline solution, such as, for example, tetra-methyl ammonium hydroxide, to remove the exposed portions of the resist layer (in the case of the positive imaging technique).

EXAMPLE THREE

REPLICATING A RESIST MASK PATTERN INTO A CONDUCTIVE LAYER TO FORM A PATTERNED CONDUCTIVE LAYER HAVING A FIRST LAYER MASK THEREON

With a patterned resist mask in place, a device such as that prepared according to the procedure set forth in Example 2 is exposed to etch conditions which remove the second region of the SiON layer and the oxide separating layer, thereby patterning the multilayer ARC to a pattern corresponding to the resist mask. This etching may advantageously be performed in a Lam Research Corp. (Fremont, Calif.) model 9400SE silicon etch tool, which uses a high density plasma with an RF frequency of about 13.56 MHz applied between the top and bottom electrodes. The lower electrode temperature is set at about 60° C. and helium clamp pressure is set at about 6 torr. Additional parameters include:

| Chamber Pressure (mT) | 10.0 |
|---|---|
| RF power applied to the top electrode (W) | 250.0 |
| RF power applied to the bottom electrode (W) | 150.0 |
| Flow rate of $CF_4$ (sccm) | 100.0 |

Under these etch conditions, SiON material is etched at a rate of about 15 angstroms per second, $SiO_2$ is etched at a rate of about 15 angstroms per second, and amorphous silicon is etched at a rate of about 20 angstroms per second. Although these etch conditions may also remove part of the second region of the amorphous silicon layer (at a rate of about 20 angstroms per second), this occurrence is acceptable since this region of amorphous silicon will be removed in subsequent etch steps.

After the ARC is patterned, with the first region of the oxide separating layer and the first region of the SiON layer remaining in place (i.e., those regions protected by the resist mask), the resist mask is removed, or stripped. When using a photoresist layer, as set forth in Example 1, the resist mask may be removed by oxygen ashing and/or dipping in a bath of heated sulfuric acid and hydrogen peroxide.

Next, the first region of the SiON layer is removed. This removal may also be advantageously performed in a Lam Research Corp. (Fremont, Calif.) model 9400SE silicon etch tool, using the same settings as set forth above for etching the ARC layer. Again, under these etch conditions, SiON material is etched at a rate of about 15 angstroms per second, $SiO_2$ is etched at a rate of about 15 angstroms per second, and amorphous silicon is etched at a rate of about 20 angstroms per second. Although these etch conditions will also etch into the exposed amorphous silicon (i.e., the second region of the amorphous silicon layer) and may also remove part of the first region of the silicon dioxide separating layer, this is acceptable so long as the silicon dioxide layer is sufficiently thick that the etch does not penetrate therethrough, since the second region of the amorphous silicon layer will be removed in subsequent etch steps.

Once the SiON is removed as described above, the remainder of the second region of the amorphous silicon layer is removed using etch conditions having selectivity between amorphous silicon and silicon dioxide (i.e., which etches the former without substantially etching the latter). This etching may advantageously be performed in a Lam Research Corp. (Fremont, Calif.) model 9400SE silicon etch tool, which uses a high density plasma with an RF frequency of about 13.56 MHz applied between the top and bottom electrodes. The lower electrode temperature is set at about 60° C. and helium clamp pressure is set at about 6 torr. An advantageous recipe for a bulk etch further includes the following parameters:

| Pressure (mT) | 10.0 |
|---|---|
| RF-Top (W) | 150.0 |
| RF-Bottom (W) | 150.0 |
| $Cl_2$ (sccm) | 50.0 |
| HBr (sccm) | 200.0 |
| 80% He—$O_2$ (sccm)* | 10.0 |

*80% He—$O_2$ refers to a gas mixture composed of 80% He and 20% $O_2$

Under these etch conditions, amorphous silicon is etched at a rate of about 20 angstroms per second and silicon dioxide is etched at a rate of about 1 angstrom per second.

Furthermore, one may use an etch recipe having a lesser selectivity between amorphous silicon and silicon dioxide as a bulk etch, or an etch recipe having a higher selectivity as an overetch. An advantageous recipe for an overetch is as follows:

| Pressure (mT) | 80.0 |
|---|---|
| RF-Top (W) | 250.0 |
| RF-Bottom (W) | 180.0 |
| HBr (sccm) | 200.0 |
| 80% He—$O_2$ (sccm)* | 5.0 |
| He (sccm) | 200.0 |
| He clamp (T) | 6.0 |

*80% He—$O_2$ refers to a gas mixture composed of 80% He and 20% $O_2$

Under these etch conditions, amorphous silicon is etched at a rate of about 10 angstroms per second and silicon dioxide is etched at a rate of about 0.1 angstrom per second. As the silicon dioxide layer is not penetrated through in either etch, the resulting semiconductor device has a patterned gate electrode having a silicon dioxide layer thereon.

EXAMPLE FOUR

REMOVING THE SILICON DIOXIDE SEPARATING LAYER FROM THE GATE ELECTRODE TO EXPOSE THE GATE ELECTRODE FOR FURTHER PROCESSING

The silicon dioxide layer on the gate electrode is readily removed in a lightly-doped drain (LDD) spacer oxide etch. The result is a semiconductor device having a patterned gate electrode thereon with the top layer of the gate electrode being substantially clean (i.e., substantially free from silicon dioxide).

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. A method, comprising:
    depositing a reflective layer on a semiconductor substrate;
    forming a multilayer anti-reflective coating having a first layer and a second layer, the first layer being positioned between the reflective layer and the second layer;
    depositing a resist layer such that the second layer is positioned between the first layer and the resist layer;
    exposing selected portions of the resist layer to electromagnetic radiation;
    developing the resist layer to create a resist mask, the resist mask defining a first region and a second region of the anti-reflective coating and a first region and a second region of the reflective layer; the first region of the anti-reflective coating and the first region of the reflective layer being positioned between the resist mask and the substrate;
    removing the second region of the anti-reflective coating to expose the second region of the reflective layer; and
    removing the resist mask, the first region of the second layer and the second region of the reflective layer to produce a semiconductor device having a patterned reflective layer with a first layer mask thereon;
    wherein the first layer comprises a different composition than the second layer, the resist mask is removed before the first region of the second layer and the second region of the reflective layer are removed, and the first region of the second layer is removed before the second region of the reflective layer.

2. The method according to claim 1, wherein the reflective layer comprises amorphous silicon.

3. The method according to claim 1, wherein the second layer comprises SiON.

4. The method according to claim 1, wherein the second layer comprises SiN.

5. The method according to claim 1, wherein the patterned reflective layer is a gate electrode, and further comprising:
   removing the first region of the first layer from the gate electrode; and
   forming a silicide layer on the gate electrode.

6. The method according to claim 1, wherein the first layer comprises silicon dioxide; wherein the second layer comprises SiON; and wherein the reflective layer comprises amorphous silicon.

7. A method, comprising:
   providing a workpiece comprising a semiconductor substrate, a reflective layer, a multilayer anti-reflective coating having a first layer and a second layer, and a resist layer; wherein the reflective layer is positioned between the substrate and the anti-reflective coating; wherein the first layer is positioned between the reflective layer and the second layer; and wherein the second layer is positioned between the first layer and the resist layer;
   exposing selected portions of the resist layer to electromagnetic radiation;
   developing the resist layer to create a resist mask, the resist mask defining a first region and a second region of the anti-reflective coating and a first region and a second region of the reflective layer;
   removing the second region of the anti-reflective coating to expose the second region of the reflective layer; and
   removing the resist mask, the first region of the second layer and the second region of the reflective layer to produce a semiconductor device having a patterned reflective layer with a first layer mask thereon,
   wherein the first layer is an oxide layer having a thickness of from about 75 to about 525 angstroms, and the second layer is a SiON layer having a thickness of from about 125 to about 1000 angstroms.

8. The method according to claim 7, wherein the oxide layer has a thickness of from about 75 to about 125 angstroms, and the SiON layer has a thickness of from about 175 to about 225 angstroms.

9. The method according to claim 8, wherein the thickness of the oxide layer is from about 90 to about 110 angstroms and the thickness of the SiON layer is from about 190 to about 210 angstroms.

10. The method according to claim 7, wherein the oxide layer has a thickness of from about 475 to about 525 angstroms, and the SiON layer has a thickness of from about 525 to about 575 angstroms.

11. The method according to claim 10, wherein the thickness of the oxide layer is from about 490 to about 510 angstroms and the thickness of the SiON layer is from about 540 to about 560 angstroms.

12. The method according to claim 7, wherein the SiON layer has an n value of from about 2 to about 2.3 and a k value of from about 0.5 to about 0.8.

13. A method for forming a gate electrode on a semiconductor device, comprising:
   depositing a reflective layer on a semiconductor substrate, the reflective layer comprising amorphous silicon;
   depositing a first layer and a second layer on the reflective layer to reduce reflections of electromagnetic radiation, the first layer comprising silicon dioxide, the first layer being positioned between the reflective layer and the second layer, and the second layer comprising a SiON layer;
   depositing a resist layer such that the second layer is positioned between the first layer and the resist layer;
   exposing selected portions of the resist layer to electromagnetic radiation;
   developing the resist layer to create a resist mask, the resist mask defining protected and unprotected regions of the first and second layers;
   removing unprotected regions of the first and second layers to define protected and unprotected regions of the reflective layer; and
   removing the resist mask, the first region of the second layer and the second region of the reflective layer to produce a transistor gate electrode having a silicon dioxide layer thereon;
   wherein the first layer comprises a different composition than the second layer.

14. A workpiece for making a semiconductor device having a gate electrode thereon comprising:
   a semiconductor substrate;
   an unpatterned reflective layer;
   an unpatterned multilayer anti-reflective coating formed such that the reflective layer lies substantially between the substrate and the anti-reflective coating; and
   a resist layer formed such that the antireflective coating lies substantially between the reflective layer and the resist layer;
   wherein the reflective layer comprises a member selected from the group consisting of amorphous silicon and polycrystalline silicon;
   wherein the multilayer anti-reflective coating comprises a first layer comprising silicon dioxide and a second layer comprising a member selected from the group consisting of SiON and SiN, the first layer being formed between the reflective layer and the second layer, and the second layer being formed between the first layer and the resist layer;
   wherein the first layer is configured for removal without damage to the reflective layer under appropriate etch conditions.

15. A method, comprising:
   depositing a reflective layer on a semiconductor substrate;
   forming a multilayer anti-reflective coating having a first layer and a second layer, the first layer being positioned between the reflective layer and the second layer and having a different composition than the second layer;
   depositing a resist layer such that the second layer is positioned between the first layer and the resist layer;
   exposing selected portions of the resist layer to electromagnetic radiation comprising ultraviolet radiation having a wavelength in a range of about 150 to about 300 nanometers;
   developing the resist layer to create a resist mask, the resist mask defining a first region and a second region of the anti-reflective coating and a first region and a second region of the reflective layer;
   removing the second region of the anti-reflective coating, the resist mask, the first region of the second layer, and the second region of the reflective layer to provide a semiconductor device having a patterned reflective layer with a first layer mask thereon.

16. The method according to claim 15, wherein the resist mask is removed before the first region of the second layer and the second region of the reflective layer are removed, and the first region of the second layer is removed before the second region of the reflective layer.

17. The method according to claim 15, wherein the reflective layer comprises amorphous silicon.

18. The method according to claim 15, wherein the radiation comprises ultraviolet radiation having a wavelength of about 193 nanometers.

19. The method according to claim 15, wherein the radiation comprises ultraviolet radiation having a wavelength of about 248 nanometers.

20. The method according to claim 15, wherein the first layer includes silicon dioxide, the second layer includes SiON, and the reflective layer includes amorphous silicon.

21. A method, comprising:
depositing a reflective layer on a semiconductor substrate;
forming a multilayer anti-reflective coating having a first layer and a second layer, the second layer including SiON or SiN, the first layer being positioned between the reflective layer and the second layer and having a different composition than the second layer;
depositing a resist layer such that the second layer is positioned between the first layer and the resist layer;
exposing selected portions of the resist layer to electromagnetic radiation;
developing the resist layer to create a resist mask, the resist mask defining a first region and a second region of the anti-reflective coating and a first region and a second region of the reflective layer;
removing the second region of the anti-reflective coating, the resist mask, the first region of the second layer, and the second region of the reflective layer to provide a semiconductor device having a patterned reflective layer with a first layer mask thereon.

22. The method according to claim 21, wherein the reflective layer comprises amorphous silicon.

23. The method according to claim 21, wherein the radiation comprises ultraviolet radiation having a wavelength of from about 150 to about 300 nanometers.

24. The method according to claim 21, wherein the second layer comprises SiON.

25. The method according to claim 21, wherein the second layer comprises SiN.

26. A method, comprising:
depositing a reflective layer on a semiconductor substrate;
forming a multilayer anti-reflective coating having a first layer and a second layer, the first layer being positioned between the reflective layer and the second layer and having a different composition than the second layer;
depositing a resist layer such that the second layer is positioned between the first layer and the resist layer;
exposing selected portions of the resist layer to electromagnetic radiation;
developing the resist layer to create a resist mask, the resist mask defining a first region and a second region of the anti-reflective coating and a first region and a second region of the reflective layer;
removing the second region of the anti-reflective coating, the resist mask, the first region of the second layer, and the second region of the reflective layer to provide a semiconductor device having a patterned reflective layer with a first layer mask thereon, the patterned reflective layer defining a gate electrode;
removing the first region of the first layer from the gate electrode; and
forming a silicide layer on the gate electrode.

27. The method according to claim 26, wherein the reflective layer comprises amorphous silicon.

28. The method according to claim 26, wherein the radiation comprises ultraviolet radiation having a wavelength of from about 150 to about 300 nanometers.

29. The method according to claim 26, wherein the second layer comprises SiN.

30. The method according to claim 26, wherein the first layer includes silicon dioxide, the second layer includes SiON, and the reflective layer includes amorphous silicon.

* * * * *